(12) United States Patent
Zhou et al.

(10) Patent No.: US 12,426,460 B2
(45) Date of Patent: Sep. 23, 2025

(54) DISPLAY PANEL AND DISPLAY TERMINAL (71) Applicant: Wuhan China Star Optoelectronics Semiconductor Display Technology Co., Ltd., Hubei (CN)

(72) Inventors: Kun Zhou, Hubei (CN); Shang Zhou, Hubei (CN); Maojun Yin, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/795,550

(22) PCT Filed: Jun. 30, 2022

(86) PCT No.: PCT/CN2022/103077
§ 371 (c)(1),
(2) Date: Jul. 27, 2022

(87) PCT Pub. No.: WO2023/236294
PCT Pub. Date: Dec. 14, 2023

(65) Prior Publication Data
US 2024/0188356 A1    Jun. 6, 2024

(30) Foreign Application Priority Data
Jun. 7, 2022  (CN) .......................... 202210642029.4

(51) Int. Cl.
*H10K 59/131*    (2023.01)
(52) U.S. Cl.
CPC ................................. *H10K 59/131* (2023.02)

(58) Field of Classification Search
CPC ..... H10K 59/131; H10D 86/60; H10D 86/443
See application file for complete search history.

(56) References Cited

U.S. PATENT DOCUMENTS 5,982,470 A * 11/1999 Nakahara .............. G02F 1/1345
349/139
6,683,669 B1 * 1/2004 Fujikawa .............. G02F 1/1345
349/149

(Continued)

FOREIGN PATENT DOCUMENTS

| CN | 101359142 | 2/2009 |
| CN | 108681415 | 10/2018 |

(Continued)

OTHER PUBLICATIONS

International Search Report and the Written Opinion Dated Dec. 21, 2022 From the International Searching Authority Re. Application No. PCT/CN2022/103077 and Its Translation Into English. (19 Pages).

*Primary Examiner* — Bitew A Dinke (57) ABSTRACT

The present application provides a display panel and a display terminal. The display panel includes a display area and a fan-out area. The fan-out area includes a plurality of fan-out wirings, and each of the fan-out wirings includes a straight section and an inclined section. The display panel further includes a plurality protection members arranged in one-to-one correspondence with the inclined sections of the plurality of fan-out routing lines, and each of the protection members is disposed close to a corresponding one of the inclined sections.

20 Claims, 5 Drawing Sheets

(56) References Cited

U.S. PATENT DOCUMENTS

| | | | | |
|---|---|---|---|---|
| 2002/0060833 | A1* | 5/2002 | Yamaguchi | G02F 1/1345 359/254 |
| 2002/0080319 | A1* | 6/2002 | Hagiwara | G02F 1/1345 349/153 |
| 2003/0095224 | A1* | 5/2003 | Asakura | G02F 1/1345 349/143 |
| 2003/0214500 | A1* | 11/2003 | Ishii | G02F 1/134363 345/211 |
| 2005/0206798 | A1* | 9/2005 | Kim | G02F 1/1345 349/54 |
| 2009/0033609 | A1* | 2/2009 | Ashizawa | G02F 1/13458 345/92 |
| 2009/0096975 | A1* | 4/2009 | Kwon | H10D 86/021 349/139 |
| 2013/0242511 | A1* | 9/2013 | Ohishi | G02F 1/13452 174/250 |
| 2013/0271708 | A1* | 10/2013 | Kusafuka | G02F 1/1345 349/106 |
| 2015/0173232 | A1* | 6/2015 | Chai | G02F 1/1345 361/748 |
| 2016/0190119 | A1* | 6/2016 | Hwang | H10D 89/911 257/72 |
| 2016/0377904 | A1* | 12/2016 | Shin | G02F 1/136286 257/776 |
| 2018/0108721 | A1* | 4/2018 | Lee | G09G 3/3233 |
| 2018/0190541 | A1* | 7/2018 | Wang | H01L 21/32139 |
| 2023/0088504 | A1* | 3/2023 | Nie | H10D 86/60 257/72 |
| 2023/0180557 | A1* | 6/2023 | Zou | H10D 86/60 257/72 |
| 2024/0304632 | A1* | 9/2024 | Li | H10D 86/441 |

FOREIGN PATENT DOCUMENTS

| | | |
|---|---|---|
| CN | 109300921 | 2/2019 |
| CN | 109445135 | 3/2019 |
| CN | 109585492 | 4/2019 |
| JP | 2000-075312 | 3/2000 |
| JP | 2009-140397 | 6/2009 |

* cited by examiner

DISPLAY PANEL AND DISPLAY TERMINAL

RELATED APPLICATIONS

This application is a National Phase of PCT Patent Application No. PCT/CN2022/103077 having International filing date of Jun. 30, 2022, which claims the benefit of priority of Chinese Patent Application No. 202210642029.4 filed on Jun. 7, 2022. The contents of the above applications are all incorporated by reference as if fully set forth herein in their entirety.

FIELD AND BACKGROUND OF THE INVENTION

The present application relates to the field of display technology, and in particular, to a display panel and a display terminal.

Active-matrix organic light-emitting diode (AMOLED) display panels have gradually become a new generation of display technology due to their high contrast ratio, wide color gamut, and low power consumption. Compared with traditional liquid crystal display panels, AMOLED display panels are easy to be flexible and are a key technology for wearable and foldable products. With the continuous development of display technology, narrow bezel technology has become a differentiated technology that attracts clients. In the prior art, the narrow bezel technology is realized by compressing widths of the fan-out wirings in the fan-out area.

In a manufacturing process, it is necessary to etch away a large area of metal at a periphery of the fan-out area. A concentration of an etchant at the periphery is high, and the fan-out wirings near the periphery may have the risk of disconnection. In the case of ensuring safety of a line width process of dense fan-out wirings, due to a loading effect of the process, a line width of the oblique fan-out wirings actually manufactured at a corner is thinner than a width of the wirings in the inner dense wiring area, and has a risk of disconnection. Therefore, there is a need to alleviate this defect.

SUMMARY OF THE INVENTION

An embodiment of the present application provides a display panel, which is used to solve the technical problem that the oblique fan-out wirings of the display panel in the prior art have a relatively thin line width actually manufactured at a corner and have a risk of disconnection.

Embodiments of the present application provide a display panel, including a display area and a fan-out area defined at one side of the display area, the fan-out area includes a plurality of fan-out wirings being insulated from each other, and each of the fan-out wirings includes: a straight section; and an inclined section electrically connected to one end of the straight section away from the display area, wherein the inclined section is arranged at an obtuse angle with the straight section; wherein the display panel further includes a plurality of protection members, the plurality of protection members are in one-to-one correspondence with the inclined sections of the plurality of fan-out wirings, each of the protection members is close to a corresponding one of the inclined sections, an orthographic projection of each of the protection members on a plane where the fan-out wirings are located is located in an area between adjacent ones of the straight sections, and each of the protection members has an included angle of greater than 0 degrees and less than 180 degrees with the straight sections.

Embodiments of the present application provide a display panel, including a display area and a fan-out area defined at one side of the display area, the fan-out area includes a plurality of fan-out wirings being insulated from each other, and each of the fan-out wirings includes: a straight section; and an inclined section electrically connected to one end of the straight section away from the display area, wherein the inclined section is arranged at an obtuse angle with the straight section; wherein the display panel further includes a plurality of protection members, the plurality of protection members are in one-to-one correspondence with the inclined sections of the plurality of fan-out wirings, each of the protection members is close to a corresponding one of the inclined sections, an orthographic projection of each of the protection members on a plane where the fan-out wirings are located is located in an area between adjacent ones of the straight sections, and each of the protection members has an included angle of greater than 0 degrees and less than 180 degrees with the straight sections; and wherein each of the protection members includes a blocking portion, the blocking portion is spaced apart from the fan-out wirings, the blocking portion is disposed in a same layer as the inclined sections, and the blocking portion is located at a side of the inclined sections close to the display area.

Embodiments of the present application provide a display terminal, including a terminal main body and a display panel, wherein the terminal main body and the display panel are combined into a whole, the display panel includes the fan-out area includes a plurality of fan-out wirings being insulated from each other, and each of the fan-out wirings includes: a straight section; and an inclined section electrically connected to one end of the straight section away from the display area, wherein the inclined section is arranged at an obtuse angle with the straight section; wherein the display panel further includes a plurality of protection members, the plurality of protection members are in one-to-one correspondence with the inclined sections of the plurality of fan-out wirings, each of the protection members is close to a corresponding one of the inclined sections, an orthographic projection of each of the protection members on a plane where the fan-out wirings are located is located in an area between adjacent ones of the straight sections, and each of the protection members has an included of greater than 0 degrees and less than 180 degrees with the straight sections.

A display panel provided by an embodiment of the present application includes a display area and a fan-out area defined at one side of the display area, the fan-out area includes a plurality of fan-out wirings arranged in isolation, and each of the fan-out wirings includes a straight section and an inclined section. The inclined section is electrically connected to one end of the straight section away from the display area, and the inclined section is arranged at an obtuse angle with the straight section; wherein the display panel further includes a plurality of protection members, the plurality of protection members are in one-to-one correspondence with the inclined sections of the plurality of fan-out wirings, each of the protection members is close to a corresponding one of the inclined sections, an orthographic projection of each of the protection members on a plane where the fan-out wirings are located is located in an area between adjacent ones of the straight sections, and each of the protection members has an included angle of greater than 0 degrees and less than 180 degrees with the straight sections. In the present application, the protection members in one-to-one correspondence with the inclined sections are arranged in an area between adjacent ones of the straight sections, each of the protection members is arranged close to a corresponding one of the inclined sections, and each of the protection members has an included angle of greater than 0 degrees and less than 180 degrees with the straight sections, so as to protect the oblique fan-out wirings at the corner, enhance the stability of the fan-out wirings, and reduce a risk of disconnection of the oblique fan-out wirings at the corner to achieve ultra-narrow bezels.

DESCRIPTION OF SPECIFIC EMBODIMENTS OF THE INVENTION

The technical solutions in the embodiments of the present application will be clearly and completely described below with reference to the accompanying drawings in the embodiments of the present application. In the drawings, for clarity and ease of understanding and description, dimensions and thicknesses of components depicted in the drawings are not to scale.

Figure 1:
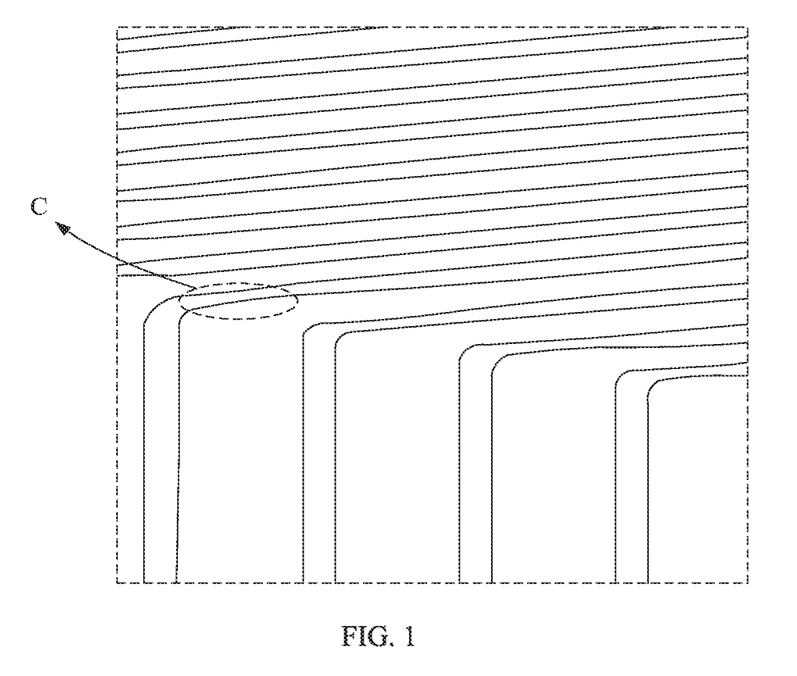
FIG. 1 is a schematic diagram of a basic structure of a fan-out wiring in the prior art.

Refers to FIG. 1, which is a schematic diagram of a basic structure of the fan-out wiring in the prior art, and is specifically a structural diagram of the fan-out wiring actually manufactured in the prior art. It is appreciated that after a bezel is compressed, a line width of the fan-out wiring is compressed correspondingly. It can be clearly seen from FIG. 1 that the fan-out wiring at the corner C is obviously thinner and has a higher risk of disconnection. Embodiments of the present application can solve the above-mentioned defects.

Figure 2:
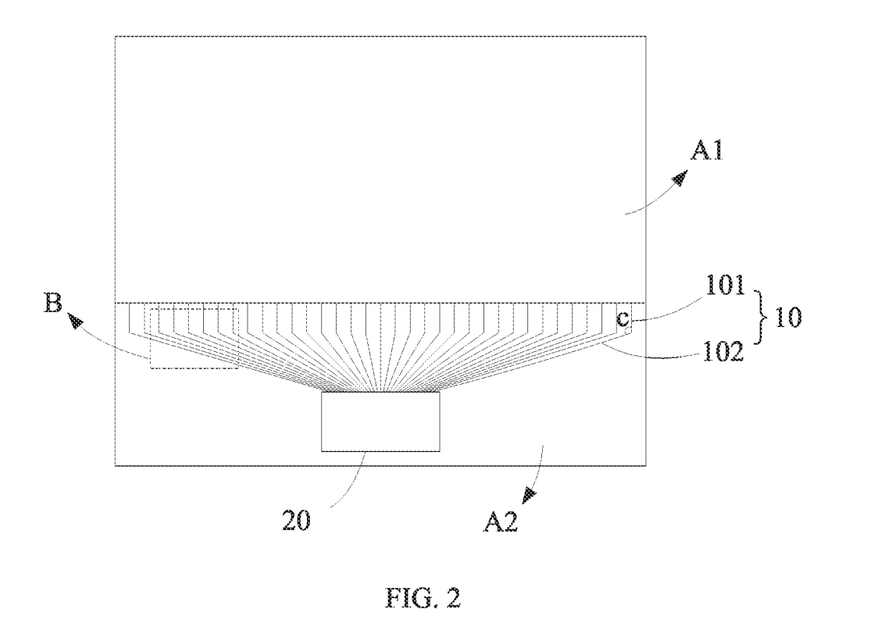
FIG. 2 is a schematic diagram of a basic structure of a display panel provided by an embodiment of the present application.

As shown in FIG. 2, which is a schematic diagram of a basic structure of a display panel provided by an embodiment of the present application, the display panel includes a display area A1 and a fan-out area A2 defined at one side of the display area A1, the fan-out area A2 includes a plurality of fan-out wirings 10 that are insulated from one another, and each of the fan-out wirings 10 includes: a straight section 101 and an inclined section 102, the inclined section 102 is electrically connected to one end of the straight section 101 away from the display area, wherein the inclined section is arranged at an obtuse angle with the straight section A1 (an angle c between the inclined section 102 and the straight section 101 is greater than 90 degrees and less than 180 degrees); wherein the display panel further includes a plurality of protection members (not shown), the plurality of protection members are in one-to-one correspondence with the inclined sections 102 of the plurality of fan-out wirings 10, each of the protection members is close to a corresponding one of the inclined sections 102, an orthographic projection of each of the protection members on a plane where the fan-out wirings 10 are located is located in an area between adjacent ones of the straight sections 101, and each of the protection members has an included angle of greater than 0 degrees and less than 180 degrees with the straight sections 101.

It is appreciated that, since the line width of the fan-out wiring is compressed to achieve a narrow bezel in the prior art, the line width of the oblique fan-out wirings actually manufactured at the corner is relatively thin, which is prone to disconnection. In the embodiment of the present application, the plurality of protection members in one-to-one correspondence with the inclined sections 102 are disposed in the area between adjacent ones of the straight sections 101, each of the protection members is close to a corresponding one of the inclined sections 102, an orthographic projection of each of the protection members on a plane where the fan-out wirings 10 are located is located in an area between adjacent ones of the straight sections 101, so as to protect the fan-out wirings 10 at the corner, the stability of the fan-out wiring 10 is enhanced under the premise of compressing the line width, and the risk of disconnection the oblique fan-out wiring 10 at the corner is reduced, so as to realize an ultra-narrow bezel.

In an embodiment, the display panel further includes an integrated circuit chip 20 located in the fan-out area A2, the integrated circuit chips 20 are configured to provide driving electrical signals required for the display area A1, and the integrated circuit chips 20 transmit driving electrical signals to the display area A1 through the fan-out wirings 10.

Figure 3:
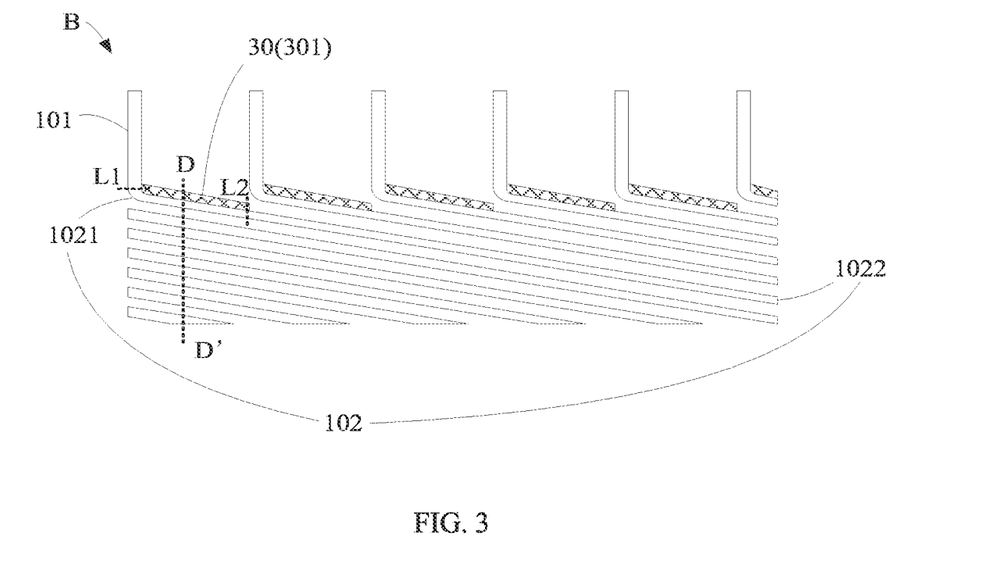
FIG. 3 is a first enlarged view of B in FIG. 2.

Next, referring FIG. 3, which is a first enlarged view of B in FIG. 2, specifically, the inclined section 102 includes a first line section 1021 and a second line section 1022. A first end of the first line section 1021 is electrically connected to one end of the straight section 101 away from the display area A1 (as shown in FIG. 1), and a second end of the first line section 1021 is electrically connected to the second line section 1022; the first line section 1021 is located in an area between one of the straight sections 101 electrically connected to the first line section 1021 and an adjacent one of the straight sections 101; wherein each of the protection members 30 includes a widened portion 301, a first end of the widened portion 301 is electrically connected to one of the straight sections 101, and a second end of the widened portion 301 is electrically connected to the second line section 1022.

It should be noted that two dotted lines L1 and L2 on the fan-out wiring 10 in FIG. 3 further explain the division of the straight section 101, the first line section 1021 and the second line segment 1022 The junction between the straight section 101 and the first line section 1021 is represented by the dotted line L1, and the junction between the first line section 1021 and the second line section 1022 is represented by the dotted line L2. That is, the first line section 1021 is located in the area between the straight section 101 on the dotted line L1 and the straight section 101 on the dotted line L2.

It is appreciated that, in this embodiment, by disposing the widened portion 301 between the straight section 101 and the second line section 1022, the widened portion 301 can widen the first line section 1021, and reduce the impact on a load effect of the wiring process due to the thinness of the first line section 1021, and the risk of disconnection of the first line section 1021 is reduced, so as to achieve the purpose of protecting the fan-out wiring 10.

In an embodiment, the widened portion 301 is disposed in contact with the first line section 1021. It is appreciated that, in this embodiment, the width of the first line section 1021 is increased by attaching the widened portion 301 to the first line section 1021, so as to compensate a load of the first line section 1021 and reduce a risk of disconnection of the first line section 1021.

It should be noted that, when the widened portion 301 and the first line section 1021 are attached, the material of the widened portion 301 can be a conductive material, or a non-conductive but corrosion-resistant material, which can reduce an influence of etchant on the first line section 1021, protect the first line section 1021, and improve the stability of the fan-out wirings 10.

In an embodiment, the widened portion 301 and the first line section 1021 are disposed in the same layer, and the widened portion 301 is located at a side of the first line section 1021 close to the display area A1.

It is appreciated that, the widened portion 301 and the first line section 1021 in this embodiment are disposed in the same layer, and can be formed in one exposure process, and the first line section 1021 is widened and compensated by using the metal in the same layer, without any additional process flow, so that the manufacturing method is simple and practical.

It should be noted that, with reference to FIG. 3, in this embodiment, by arranging the widened portion 301 at the side of the first line section 1021 close to the display area A1, a distance between the first line section 1021 and a second line section 1022 of an adjacent one of the fan-out wirings 10 can be prevented from changing, which may otherwise result in a short circuit between the first line section 1021 and the second line section 1022 of an adjacent one of the fan-out wirings 10, thus improving the stability of the fan-out wirings 10.

In an embodiment, in a direction perpendicular to an extending direction of the inclined section 102, a sum of the width of the first line section 1021 and the width of the widened portion 301 is greater than or equal to the width of the second line section 1022.

It is appreciated that, before the widened portion 301 is provided, the width of the first line section 1021 is smaller than the width of the second line section 1022 in a direction perpendicular to an extending direction of the inclined section 102, which causes the first line section 1021 to be prone to disconnection. In this embodiment, the widened portion 301 is provided, and the sum of the width of the first line section 1021 and the width of the widened portion 301 is greater than or equal to the width of the second line section 1022, that is, the widened portion 301 can increase the width of the first line section 1021, so that the risk of disconnection of the first line section 1021 can be reduced.

In an embodiment, in a direction perpendicular to an extending direction of the inclined section 102, a sum of the width of the first line section 1021 and the width of the widened portion 301 is greater than or equal to 1.8 μm.

It should be noted that, in this embodiment, the widened portion 301 specifically compensates for the portion where the line width of the first line section 1021 is less than 1.8 micrometers, and compensates the line width of the first line section 1021 to 1.8 micrometers or more than 1.8 microns.

Figure 4:
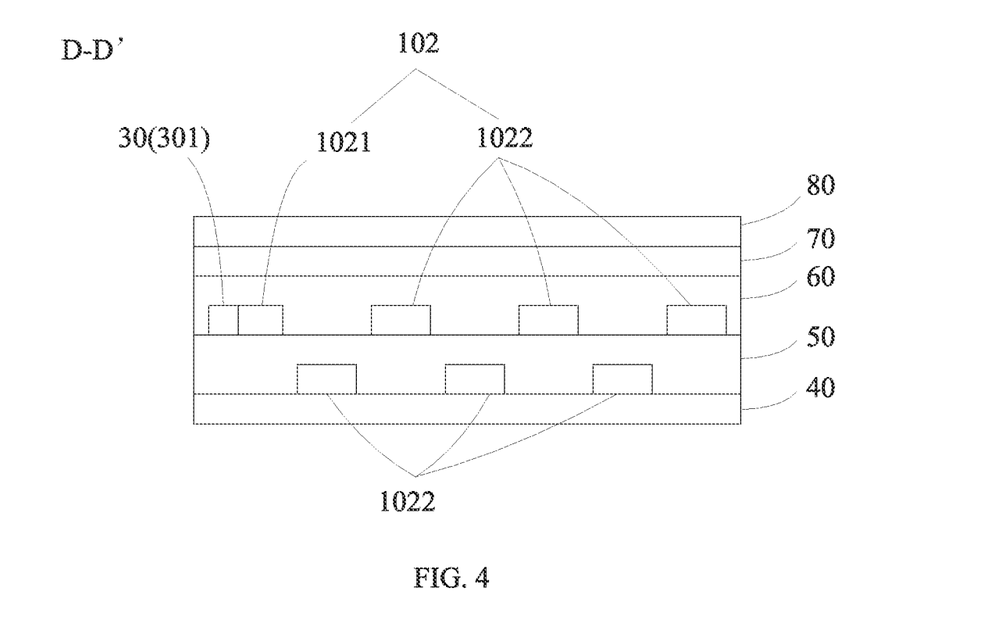
FIG. 4 is a cross-sectional view taken along the line D-D' in FIG. 3.

In one embodiment, refers to FIG. 4, which is a cross-sectional view taken along the line DD' in FIG. 3, that is, a film stacking diagram of the display panel in the fan-out area A2. It should be noted that FIG. 4 illustrates an example in which the inclined sections 102 are arranged in the same layers as the first gate metal layer and the second gate metal layer respectively. In other embodiments, the inclined sections 102 may be arranged in the same layer only with the first gate metal layer or only with the second gate metal layer.

Specifically, the inclined sections 102 of the plurality of fan-out wirings 10 in this embodiment are alternately routed in the first gate metal layer and the second gate metal layer, that is, the inclined sections 102 of adjacent ones of the fan-out wirings 10 respectively located in the first gate metal layer and the second gate metal layer. The first line section 1021 of the inclined section 102 close to the display area A1 is thinner than the second line section 1022 and is prone to disconnection. In the present application, the protection member 30 is provided at the first line section 1021, and the protection member 30 including a widened portion 301 is arranged on the same layer as the first line section 1021 to increase the width of the first line section 1021 and reduce the risk of disconnection of the first line section 1021, so as to achieve the purpose of protecting the fan-out wirings 10.

It should be noted that, as shown in FIG. 4, when the inclined sections 102 of adjacent ones of the fan-out wirings 10 are located in the first gate metal layer and the second gate metal layer respectively, that is, when adjacent ones of the inclined sections 102 are arranged in different layers, the widened portion 301 can also be arranged on the side of the first line section 1021 away from the display area A1, that is, arranged above an adjacent inclined section 102, and no short circuit will occur in this case.

In this embodiment, the display panel includes a substrate layer 40, an insulating layer 50, a planarization layer 60, a first passivation layer 70, and a second passivation layer 80; and the first gate metal layer is located on the substrate layer 40 and the insulating layer 50. The second gate metal layer is located between the insulating layer 50 and the planarization layer 60, the first passivation layer 70 is located on a side of the planarization layer 60 away from the insulating layer 50, and the second passivation layer 80 is located on a side of the first passivation layer 70 away from the planarization layer 60 is.

Figure 5A:
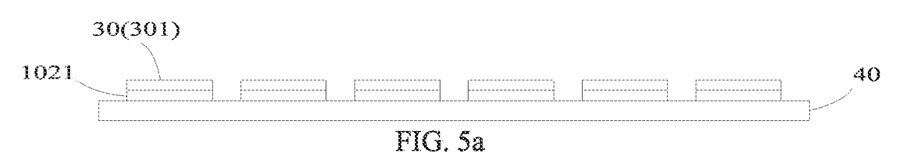
FIG. 5a and FIG. 5b are relative positional relationship diagrams of a widened portion and a first line section provided by embodiments of the present application.
Figure 5B:
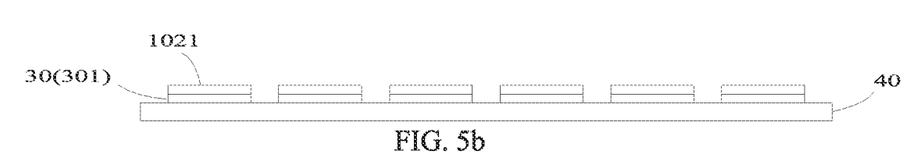

In an embodiment, as shown in FIG. 5a and FIG. 5b, which are relative positional relationship diagrams of a widened portion and a first line section provided by embodiments of the present application, in the direction of the light-exiting side of the display panel, the widened portion 301 and the first line section 1021 are stacked, and both the widened portion 301 and the first line section 1021 are disposed on the substrate layer 40. It should be noted that, in this embodiment, by arranging the widened portion 301 above the first line section 1021 (as shown in FIG. 5a) or below the first line section 1021 (as shown in FIG. 5b), the first line section 1021 can be widened without impacting an original arrangement of the fan-out wirings 10.

Figure 6:
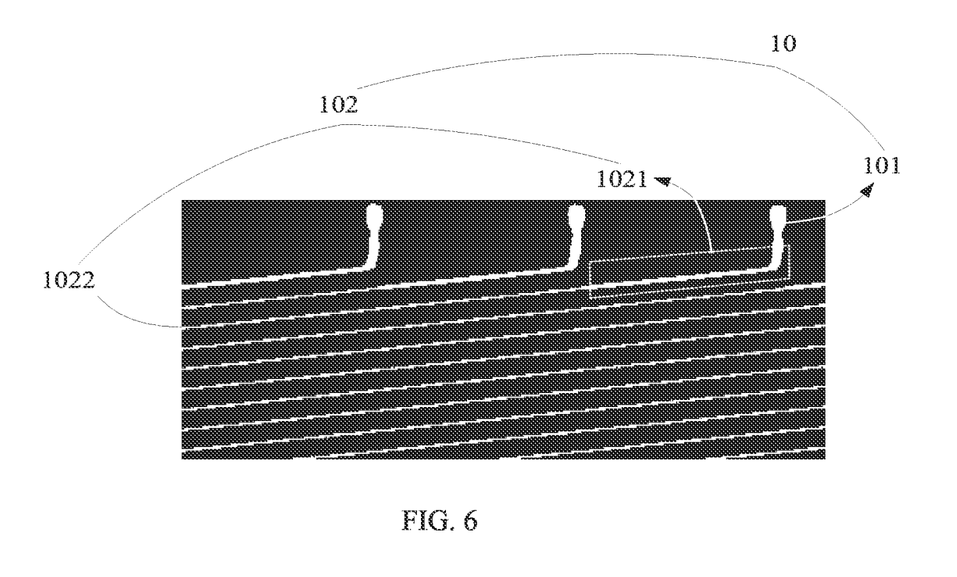
FIG. 6 is a schematic diagram of a basic structure of fan-out wirings provided by an embodiment of the present application.

Next, refers to FIG. 6, which is a schematic diagram of a basic structure of fan-out wirings provided by an embodiment of the present application, and specifically a structural diagram of the fan-out wirings 10 actually manufactured in the present application. In the present application, a widening compensation is performed at the first line section 1021, and after compensation, a line width of the exposed wiring (the first line section 1021) and a line width of the second line section 1022 in the inner dense wiring area are equivalent, thereby reducing a risk of disconnection of the first line sections 1021

Figure 7:
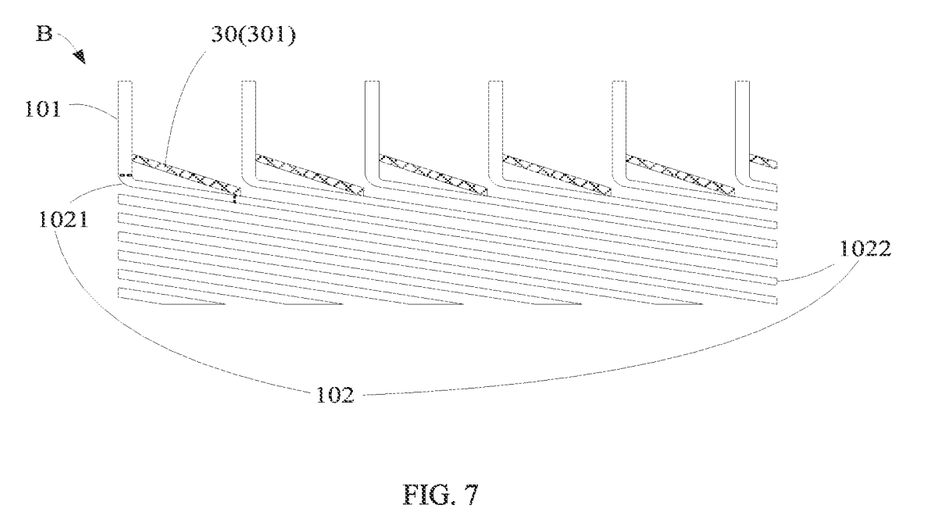
FIG. 7 is a second enlarged view of B in FIG. 2.

Next, referring FIG. 7, which is a second enlarged view of B in FIG. 2, specifically, the inclined section 102 includes a first line section 1021 and a second line section 1022. A first end of the first line section 1021 is electrically connected to one end of the straight section 101 away from the display area A1 (as shown in FIG. 1), and a second end of the first line section 1021 is electrically connected to the second line section 1022; the first line section 1021 is located in an area between one of the straight sections 101 electrically connected to the first line section 1021 and an adjacent one of the straight sections 101; wherein each of the protection members 30 includes a widened portion 301, a first end of the widened portion 301 is electrically connected to one of the straight sections 101, and a second end of the widened portion 301 is electrically connected to the second line section 1022. In this embodiment, the widened portion 301 is disposed separately from the first line section 1021, and the widened portion 301 is located at a side of the first line section 1021 close to the display area A1.

It is appreciated that in this embodiment, a first end of the widened portion 301 is electrically connected to one of the straight sections 101, a second end of the widened portion 301 is electrically connected to the second line section 1022, but the widened portion 301 is disposed separately from the second line section 1022, that is, the driving electrical signal on the second line section 1022 can be transmitted to the straight section 101 through the first line section 1021, and the driving electrical signal on the second line section 1022 can also be transmitted to the straight section 101 through the widened portion 301. It is equivalent to that the widening section 301 and the first line section 1021 are arranged in parallel, if the first line section 1021 is disconnected, the driving electrical signal can also be transmitted through the widening section 301, which will not cause abnormal display of a partial screen of the display panel.

It should be noted that a material of the widened portion 301 in this embodiment is a conductive material.

Figure 8:
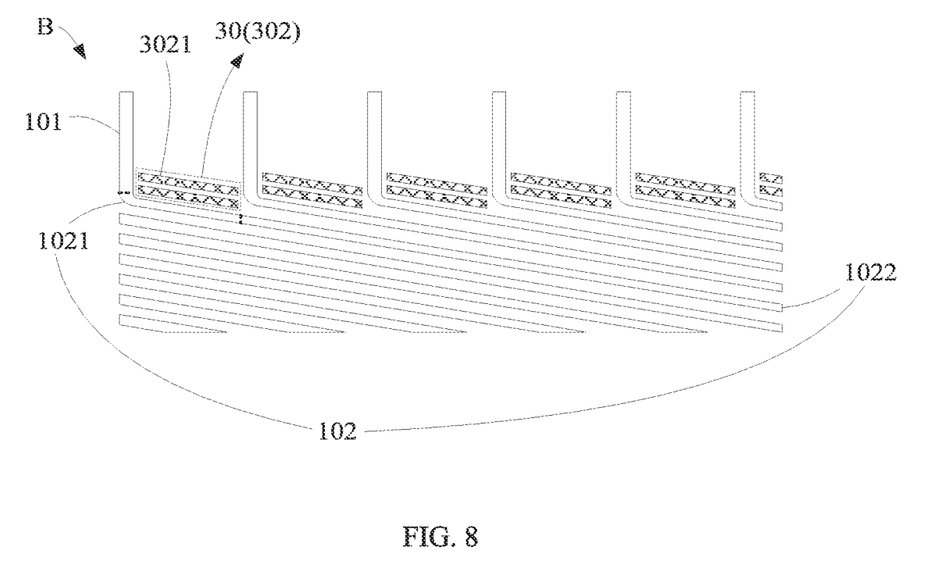
FIG. 8 is a third enlarged view of B in FIG. 2.

Next, referring FIG. 8, which is a third enlarged view of B in FIG. 2. In this embodiment, each of the protection members 30 includes a blocking portion 302, the blocking portion 302 is disposed separately from the fan-out wirings 10, the blocking portion 302 and the inclined section 102 are disposed in the same layer, and the blocking portion 302 is located at a side of the inclined section 102 close to the display area A1.

It is appreciated that, in this embodiment, by disposing the blocking portion 302 at the side of the inclined section 102 close to the display area A1, the blocking portion 302 can block the etchant at the peripheral, so as to prevent the etchant from over-etching the first line section 1021 and causing disconnection of the first line section 1021. It should be noted that the material of the blocking portion 302 may be a corrosion-resistant non-conductive material or a conductive material.

In one embodiment, the blocking portion 302 includes a plurality of blocking line sections 3021, and the plurality of the blocking line sections 3021 are provided separately. It should be noted that the blocking portion 302 is composed of a plurality of blocking line sections 3021, the plurality of blocking line sections 3021 are arranged in parallel with the inclined sections 102, and a distance between the plurality of blocking line sections 3021 is gradually decreased along a direction away from the display area A1 (as shown in FIG. 1). It is appreciated that when a distance between the plurality of blocking line sections 3021 gradually decreases along a direction away from the display area A1, that is, the blocking line sections 3021 close to the inclined section 102 are set more densely, which can improve the blocking effect and prevent the etchant at the periphery from over-etching of the first line section 1021 to cause disconnection of the first line section 1021.

It should be noted that when the material of the blocking portion 302 is a non-conductive material, the blocking portion 302 will not cause a short circuit between adjacent ones of the fan-out wirings 10, and distances between the blocking portion 302 and ones of the straight sections 101 on both the left and right sides of the blocking portion 302 can be further reduced to improve the blocking effect.

In an embodiment, the width of the blocking line section 3021 is equal to the width of the inclined section 102 in a direction perpendicular to an extending direction of the inclined section 102. It should be noted that, the blocking line section 3021 and the inclined section 102 can be manufactured by using the same photomask to save production cost.

In an embodiment, in the extending direction of the straight section 101, the distance between the blocking portion 302 and the inclined section 102 is smaller than the distance between adjacent ones of the inclined sections 102. It is appreciated that, in this embodiment, by setting the distance between the blocking portion 302 and the inclined section 102 to be smaller than the distance between adjacent ones of the inclined sections 102, the blocking effect can be improved.

Figure 9:
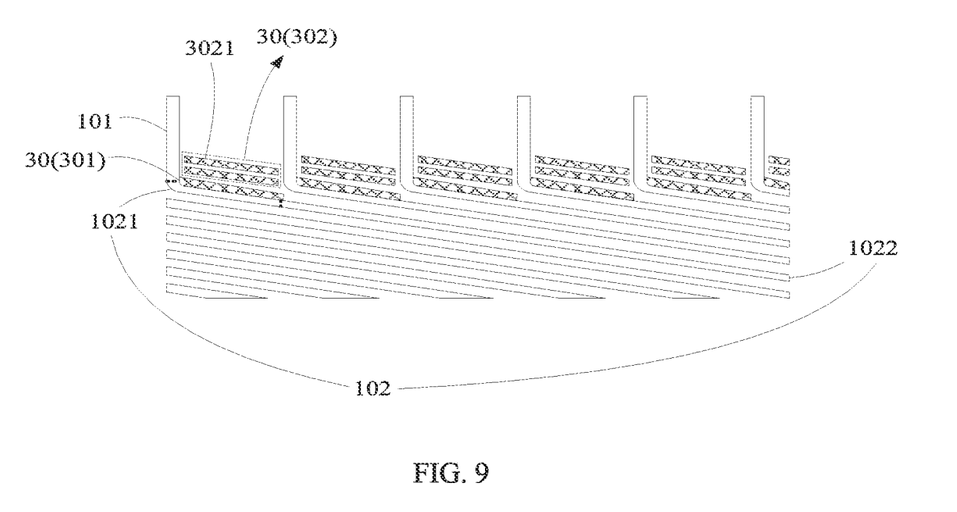
FIG. 9 is a fourth enlarged view of B in FIG. 2.

In one embodiment, as shown in FIG. 9, which is a fourth enlarged view of B in FIG. 2, each of the protection members 30 includes a widened portion 301 and a blocking portion 302. A first end is electrically connected to one of the straight sections 101, the second end of the widened portion 301 is electrically connected to the second line section 1022, the blocking portion 302 is separated from the fan-out wiring 10, the blocking portion 302 is disposed on the same layer as the inclined section 102, and the blocking portion 302 is located at the side of the inclined section 102 close to the display area A1.

It is appreciated that, in this embodiment, by dividing the protection member 30 into a widened portion 301 and a blocking portion 302, the widened portion 301 can widen the first line section 1021 and reduce the risk of disconnection of the first line section 1021, and the blocking portion 302 can block the etchant to prevent the etchant from over-etching the first line section 1021, and can also reduce the risk of disconnection of the first line section 1021. This embodiment can further improve the stability of the fan-out wirings 10.

In this embodiment, the widened portion 301 is disposed in contact with the first line section 1021. It is appreciated that, in this embodiment, the width of the first line section 1021 is increased by attaching the widened portion 301 to the first line section 1021, so as to compensate a load of the first line section 1021 and reduce a risk of disconnection of the first line section 1021.

It should be noted that, when the widened portion 301 and the first line section 1021 are attached, the material of the widened portion 301 can be a conductive material, or a non-conductive but corrosion-resistant material, which can reduce an influence of etchant on the first line section 1021, protect the first line section 1021, and improve the stability of the fan-out wirings 10.

In an embodiment, the widened portion 301 and the first line section 1021 are disposed in the same layer, and the widened portion 301 is located at a side of the first line section 1021 close to the display area A1.

It is appreciated that, the widened portion 301 and the first line section 1021 in this embodiment are disposed in the same layer, and can be formed in one exposure process, and the first line section 1021 is widened and compensated by using the metal in the same layer, without any additional process flow, so that the manufacturing method is simple and practical.

It should be noted that, in this embodiment, by arranging the widened portion 301 at the side of the first line section 1021 close to the display area A1, a distance between the first line section 1021 and a second line section 1022 of an adjacent one of the fan-out wirings 10 can be prevented from changing, which may otherwise result in a short circuit between the first line section 1021 and the second line section 1022 of an adjacent one of the fan-out wirings 10, thus improving the stability of the fan-out wirings 10.

In an embodiment, in a direction perpendicular to an extending direction of the inclined section 102, a sum of the width of the first line section 1021 and the width of the widened portion 301 is greater than or equal to the width of the second line section 1022.

It is appreciated that, before the widened portion 301 is provided, the width of the first line section 1021 is smaller than the width of the second line section 1022 in a direction perpendicular to an extending direction of the inclined section 102, which causes the first line section 1021 to be prone to disconnection. In this embodiment, the widened portion 301 is provided, and the sum of the width of the first line section 1021 and the width of the widened portion 301 is greater than or equal to the width of the second line section 1022, that is, the widened portion 301 can increase the width of the first line section 1021, so that the risk of disconnection of the first line section 1021 can be reduced.

In an embodiment, in a direction perpendicular to an extending direction of the inclined section 102, a sum of the width of the first line section 1021 and the width of the widened portion 301 is greater than or equal to 1.8 µm.

It should be noted that, in this embodiment, the widened portion 301 specifically compensates for the portion where the line width of the first line section 1021 is less than 1.8 micrometers, and compensates the line width of the first line section 1021 to 1.8 micrometers or more than 1.8 microns.

In an embodiment, in the direction of the light-exiting side of the display panel, the widened portion 301 and the first line section 1021 are stacked. It should be noted that, by arranging the widened portion 301 above or below the first line section 1021 in this embodiment, the first line section 1021 can be widened without impacting an original arrangement of the fan-out wirings 10.

In an embodiment, the widened portion 301 is disposed separately from the first line section 1021, and the widened portion 301 is located at a side of the first line section 1021 close to the display area A1. It is appreciated that in this embodiment, a first end of the widened portion 301 is electrically connected to one of the straight sections 101, a second end of the widened portion 301 is electrically connected to the second line section 1022, but the widened portion 301 is disposed separately from the second line section 1022, that is, the driving electrical signal on the second line section 1022 can be transmitted to the straight section 101 through the first line section 1021, and the driving electrical signal on the second line section 1022 can also be transmitted to the straight section 101 through the widened portion 301. It is equivalent to that the widening section 301 and the first line section 1021 are arranged in parallel, if the first line section 1021 is disconnected, the driving electrical signal can also be transmitted through the widening section 301, which will not cause abnormal display of a partial screen of the display panel.

Embodiments of the present application further provide a display terminal, including a terminal body and the above-mentioned display panel, wherein the terminal body and the display panel are combined into a whole. Specific structure of the display panel can be referred to related descriptions for FIG. 2 to FIG. 9, which will not be repeated herein for brevity. The display terminal provided by an embodiment of the present application may be a product or component with a display function, such as a mobile phone, a tablet computer, a notebook computer, a TV, a digital camera, a navigator, and so on.

The display panel and the display terminal provided by the embodiments of the present application are described in detail above. It should be understood that the exemplary embodiments described herein should be regarded as descriptive only, and are used to help understand the method and the core idea of the present application, but not to limit the present application.

What is claimed is:

1. A display panel, comprising a display area and a fan-out area defined at one side of the display area, the fan-out area comprises a plurality of fan-out wirings being insulated from each other, and each of the fan-out wirings comprises:
   a straight section; and
   an inclined section electrically connected to one end of the straight section away from the display area, wherein the inclined section is arranged at an obtuse angle with the straight section;
   wherein the display panel further comprises a plurality of protection members, the plurality of protection members are in one-to-one correspondence with the inclined sections of the plurality of fan-out wirings, each of the protection members is close to a corresponding one of the inclined sections, an orthographic projection of each of the protection members on a plane where the fan-out wirings are located is located in an area between adjacent ones of the straight sections, and each of the protection members has an included angle of greater than 0 degrees and less than 180 degrees with the straight sections;
   wherein each of the inclined sections comprises a first line section and a second line section; and
   wherein each of the protection members comprises a widened portion, a first end of the widened portion is electrically connected to one of the straight sections, and a second end of the widened portion is electrically connected to the second line section.

2. The display panel according to claim 1, a first end of the first line section is electrically connected to the end of the straight section away from the display area, a second end of the first line section is electrically connected to the second line section, and the first line section is located in an area between one of the straight sections electrically connected to the first line section and an adjacent one of the straight sections.

3. The display panel according to claim 1, wherein the widened portion is disposed in contact with the first line section.

4. The display panel according to claim 1, wherein the widened portion is disposed in a same layer as the first line section, and the widened portion is located at a side of the first line section close to the display area.

5. The display panel according to claim 1, wherein, in a direction perpendicular to an extending direction of the inclined section, a sum of a width of the first line section and a width of the widened portion is greater than or equal to a width of the second line section.

6. The display panel according to claim 1, wherein, in a direction perpendicular to an extending direction of the inclined sections, a sum of a width of the first line section and a width of the widened portion is greater than or equal to 1.8 micrometers.

7. The display panel according to claim 1, wherein, in a direction of a light-exiting side of the display panel, the widened portion and the first line section are stacked.

8. The display panel according to claim 1, wherein the widened portion is spaced apart from the first line section, and the widened portion is located at a side of the first line section close to the display area.

9. The display panel according to claim 1, wherein each of the protection members comprises a blocking portion, the blocking portion is spaced apart from the fan-out wirings, the blocking portion is disposed in a same layer as the inclined sections, and the blocking section is located at a side of the inclined sections close to the display area.

10. The display panel according to claim 9, wherein the blocking portion comprises a plurality of blocking line sections, and the plurality of blocking line sections are arranged separately.

11. The display panel according to claim 10, wherein, in a direction perpendicular to an extending direction of the inclined sections, a width of the blocking line section is equal to a width of each of the inclined sections.

12. The display panel according to claim 9, wherein, in an extending direction of the straight sections, a distance between the blocking portion and the inclined section is smaller than a distance between adjacent ones of the inclined sections.

13. The display panel according to claim 1, wherein a material of the widened portion is a conductive material, or a non-conductive but corrosion-resistant material.

14. The display panel according to claim 9, wherein a material of the blocking portion is a corrosion-resistant non-conductive material or a conductive material.

15. The display panel according to claim 10, wherein the plurality of blocking line sections are arranged in parallel with the inclined sections.

16. A display terminal, comprising a terminal main body and a display panel, wherein the terminal main body and the display panel are combined into a whole, the display panel comprises the fan-out area comprises a plurality of fan-out wirings being insulated from each other, and each of the fan-out wirings comprises:

a straight section; and an inclined section electrically connected to one end of the straight section away from the display area, wherein the inclined section is arranged at an obtuse angle with the straight section;

wherein the display panel further comprises a plurality of protection members, the plurality of protection members are in one-to-one correspondence with the inclined sections of the plurality of fan-out wirings, each of the protection members is close to a corresponding one of the inclined sections, an orthographic projection of each of the protection members on a plane where the fan-out wirings are located is located in an area between adjacent ones of the straight sections, and each of the protection members has an included of greater than 0 degrees and less than 180 degrees with the straight sections;

wherein each of the inclined sections comprises a first line section and a second line section; and wherein each of the protection members comprises a widened portion, a first end of the widened portion is electrically connected to one of the straight sections, and a second end of the widened portion is electrically connected to the second line section.

17. The display terminal according to claim 16, a first end of the first line section is electrically connected to the end of the straight section away from the display area, a second end of the first line section is electrically connected to the second line section, and the first line section is located in an area between one of the straight sections electrically connected to the first line section and an adjacent one of the straight sections.

18. The display terminal according to claim 16, wherein the widened portion is spaced apart from the first line section, and the widened portion is located at a side of the first line section close to the display area.

19. The display terminal according to claim 16, wherein each of the protection members comprises a blocking portion, the blocking portion is spaced apart from the fan-out wiring, the blocking portion is disposed in a same layer as the inclined sections, and the blocking section is located at a side of the inclined sections close to the display area.

20. The display terminal according to claim 19, wherein, in an extending direction of the straight sections, a distance between the blocking portion and the inclined section is smaller than a distance between adjacent ones of the inclined sections.

* * * * *